(12) United States Patent
Liu et al.

(10) Patent No.: US 7,993,092 B2
(45) Date of Patent: Aug. 9, 2011

(54) MOVING CARRIER FOR LEAD FRAME AND METHOD OF MOVING LEAD FRAME USING THE MOVING CARRIER

(75) Inventors: Yibo Liu, Jiangsu Province (CN); Qiang Chen, Jiangsu Province (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 387 days.

(21) Appl. No.: 12/190,426

(22) Filed: Aug. 12, 2008

(65) Prior Publication Data
US 2009/0047111 A1 Feb. 19, 2009

(30) Foreign Application Priority Data
Aug. 14, 2007 (CN) .......................... 2007 1 0143604

(51) Int. Cl.
*B65G 1/133* (2006.01)
(52) U.S. Cl. ...................... 414/749.6; 257/685; 174/529
(58) Field of Classification Search .................. 294/1.1; 414/937, 749.6, 288; 216/13, 17; 257/666, 257/668, 685, 686; 174/529
See application file for complete search history.

(56) References Cited

U.S. PATENT DOCUMENTS

| | | | | |
|---|---|---|---|---|
| 3,825,801 A | * | 7/1974 | Beavitt et al. | 361/767 |
| 4,195,193 A | * | 3/1980 | Grabbe et al. | 174/529 |
| 5,115,299 A | * | 5/1992 | Wright | 257/668 |
| 6,731,011 B2 | * | 5/2004 | Verma et al. | 257/777 |
| 6,847,104 B2 | * | 1/2005 | Huang et al. | 257/685 |
| 2004/0036154 A1 | * | 2/2004 | Ho et al. | 257/678 |
| 2005/0051877 A1 | * | 3/2005 | Hsu | 257/667 |

FOREIGN PATENT DOCUMENTS

| | | |
|---|---|---|
| JP | 05-243301 | 9/1993 |
| JP | 06-349870 | 12/1994 |
| JP | 08-250525 | 9/1996 |

OTHER PUBLICATIONS

English language abstract of Japanese Publication No. 05-243301.
English language abstract of Japanese Publication No. 06-349870.
English language abstract of Japanese Publication No. 08-250525.

* cited by examiner

*Primary Examiner* — Saul Rodriguez
*Assistant Examiner* — Stephen Vu
(74) *Attorney, Agent, or Firm* — Muir Patent Consulting, PLLC

(57) ABSTRACT

Provided are a moving carrier for a lead frame, and a method of moving a lead frame using the moving carrier. The moving carrier includes a base which supports the lead frame including a body and a chip attach pad on which a chip is disposed. The moving carrier includes a groove portion which is integrated with a part of the base and contains the chip attach pad of the lead frame. The lead frame is inserted or withdrawn into or out from a magazine using the moving carrier and thus without deformation of the lead frame or damage to the chip.

18 Claims, 6 Drawing Sheets

MOVING CARRIER FOR LEAD FRAME AND METHOD OF MOVING LEAD FRAME USING THE MOVING CARRIER

CROSS-REFERENCE TO RELATED APPLICATIONS

This application claims the benefit of China Patent Application No. 200710143604.1, filed on Aug. 14, 2007, in the State Intellectual Property Office of the People's Republic of China, and the benefit of Korean Patent Application No. 10-2008-0072949, filed on Jul. 25, 2008, in the Korean Intellectual Property Office, the entire contents of which are hereby incorporated in their entirety by reference.

BACKGROUND OF THE INVENTIVE CONCEPT

The present inventive concept relates to a moving carrier which can be easily inserted or withdrawn into or from a magazine with respect to a lead frame during a semiconductor packaging process of an integrated circuit (IC) chip, and a method of moving a lead frame using the moving carrier.

Generally, a plurality of integrated circuit (IC) chips or semiconductor chips are manufactured on a wafer, for example, a silicon wafer. An IC chip manufactured on a wafer is usually called a die, and becomes a semiconductor package that can be assembled for use in an electronic component via a packaging process. In the packaging process, the IC chip is processed by attaching the IC chip to a lead frame that has one or more metal plates in a strip-type configuration. Leads of the lead frame are connected to the IC chip using metal bonding wires, such as gold wires. The packaging process of the IC chip using the lead frame includes a plurality of steps, such as a die attaching process, a lead bonding process, and a molding process.

An exemplary packaging process will now be described in detail. An IC chip manufactured on a wafer is attached to a chip attach pad (or die attach pad) of a lead frame using a die bonder. The IC chip and the lead frame are connected to metal bonding wires using a lead bonder (or a wire bonder), and then the lead frame to which the IC chip is attached is transferred to a molding apparatus and molded. During the series of operations of the packaging process, the lead frame is stacked in a magazine, and machine equipment automatically inserts or withdraws the lead frame into or from the magazine.

However, in the packaging process, a person often has to directly insert or withdraw the lead frame to or from the magazine to facilitate inspections and experiments on the IC chip or the packaging process. Accordingly, a person holds the lead frame in their hand for an extended period of time, causing the lead frame to deform due to stress applied on the lead frame. Consequently, the metal bonding wires may sag due to the lead frame being held outside the magazine.

Moreover, as electronic products such as portable electronic products, are becoming lighter and thinner, and the requirements for miniaturization and low costs are increasing, the thickness of the lead frame is becoming thinner, the metal bonding wires are becoming thinner, and the lengths, i.e., spans, of the metal bonding wires are becoming longer. Also, the pitch between electrodes in the IC chip is becoming smaller, and a distance between leads in the lead frame is also being reduced to provide high-quality electrical input/output (I/O) characteristics. Accordingly, when the lead frame is manually inserted or withdrawn into or from the magazine, the adverse effects of metal bonding wire sagging and lead frame deformation can increase.

SUMMARY

The present inventive concept relates to a moving carrier that can avoid direct contact with a lead frame while inserting or withdrawing the lead frame into or from a magazine during a packaging process.

The present inventive concept also relates to a method of moving a lead frame, which can prevent a lead frame from deforming and metal bonding wires bonded to a chip on the lead frame from sagging, by using the moving carrier.

According to an aspect of the present inventive concept, there is provided a moving carrier for moving a lead frame. The moving carrier includes a base which supports the lead frame including a body and a chip attach pad on which a chip is disposed. The moving carrier includes a groove portion which is integrated with a part of the base and receives the chip attach pad of the lead frame.

BRIEF DESCRIPTION OF THE DRAWINGS

The above and other features and advantages of the present inventive concept will become more apparent by describing in detail exemplary embodiments thereof with reference to the attached drawings in which.

DETAILED DESCRIPTION OF THE EMBODIMENTS

Figure 1:
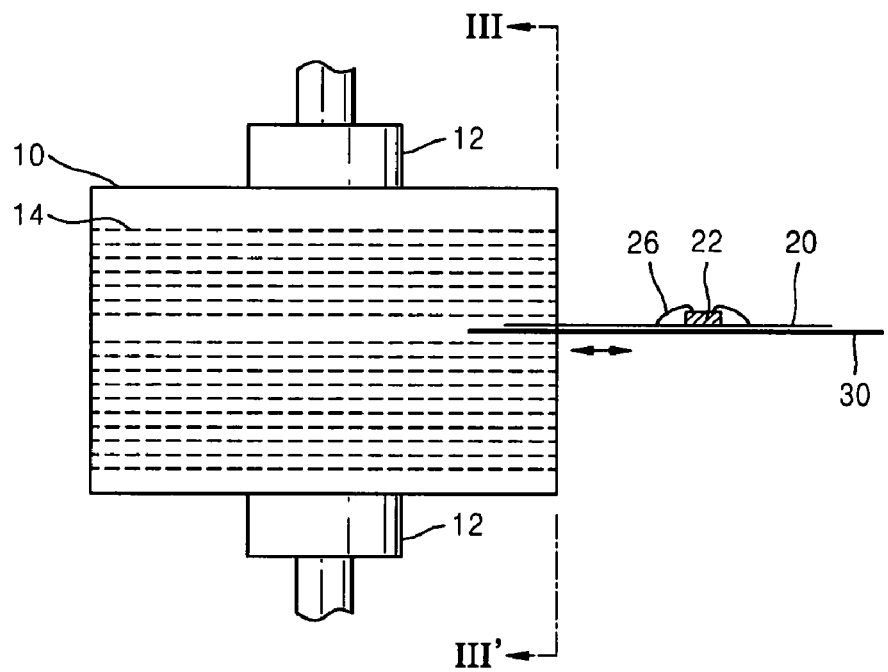
FIGS. 1 and 2 are cross-sectional views illustrating insertion and withdrawal of a moving carrier loaded with a lead frame into and out from a magazine, according to embodiments of the present inventive concept.

Hereinafter, the present inventive concept will be described more fully with reference to the accompanying drawings, in which exemplary embodiments of the inventive concept are shown. The present inventive concept, however, can be embodied in many different forms and should not be construed as being limited to the embodiments set forth herein; rather, these embodiments are provided so that this disclosure will be thorough and complete, and will fully convey the inventive concept to those skilled in the art.

In the drawings, like reference numerals denote like elements, and the sizes of elements may be exaggerated for clarity. Also, the top and bottom of an element in the drawings may be altered by turning the drawings upside down.

Figure 2:
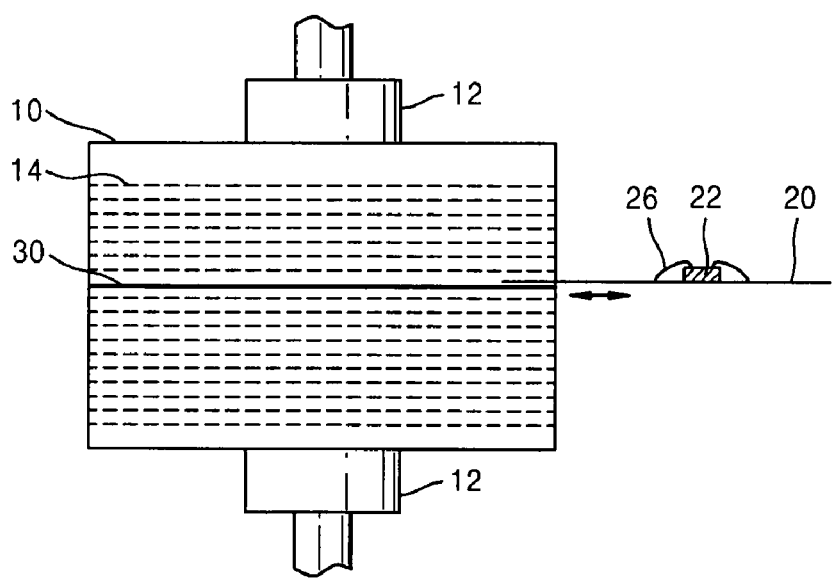

FIGS. 1 and 2 are cross-sectional views illustrating insertion and withdrawal of a moving carrier 30, loaded with a lead frame 20, into and out from a magazine 10, according to embodiments of the present inventive concept.

In detail, FIGS. 1 and 2 illustrate a section of the magazine 10. As illustrated in 5 FIGS. 1 and 2, the magazine 10, for receiving the lead frame 20 loaded on the moving carrier 30, is prepared. The moving carrier 30 is described in more detail below. The magazine 10 is fixed essentially motionless by a magazine jig 12, and includes a plurality of slots 14 for holding the moving carrier 30 and the lead frame 20. Also, the plurality of slots 14 are installed substantially parallel to each other in the magazine 10.

In a packaging process, a chip 22 is attached on the lead frame 20 using a die bonder, and the chip 22 is connected to the lead frame 20 using metal bonding wires 26. The chip 22 and the metal bonding wires 26 are connected using a lead bonder (or wire bonder). The chip 22 and the metal bonding wires 26 on the lead frame 20 may be molded using a molding material, but the description thereof is omitted with respect to FIG. 1 for convenience of explanation.

The lead frame 20 is loaded on the moving carrier 30. In other words, the lead frame 20 is physically supported on the moving carrier 30, and thus sagging of the metal bonding wires 26 or deformation of the lead frame 20 is prevented when the lead frame is outside of the magazine 10. The lead frame 20, loaded on the moving carrier 30, is inserted into one of the slots 14 of the magazine 10 in a direction indicated by the arrow in FIG. 1.

According to an embodiment of the present inventive concept, as shown in FIG. 1 and as described below in a method of moving the lead frame 20, the lead frame 20 loaded on the moving carrier 30 is inserted, together with the moving carrier 30, into the slot 14 of the magazine 10.

According to another embodiment of the present inventive concept, as shown in FIG. 25 2 and as described below in a method of moving of the lead frame 20, the lead frame 20 can be inserted once the moving carrier 30 is pre-inserted into the slot 14 of the magazine 10. Then, the lead frame 20 loaded on the moving carrier 30 is withdrawn in a direction indicated by the arrow in FIG. 2 and then manipulated by hand or using a mechanical device, for an inspection or experiment as an example.

Because the lead frame 20 is loaded on the moving carrier 30 while inserted or withdrawn into or out from the magazine 10, the lead frame 20 is not bent even when the thickness of the lead frame 20 is small. Accordingly, the lead frame 20 is not deformed, and the metal bonding wires 26 do not sag.

Figure 3:
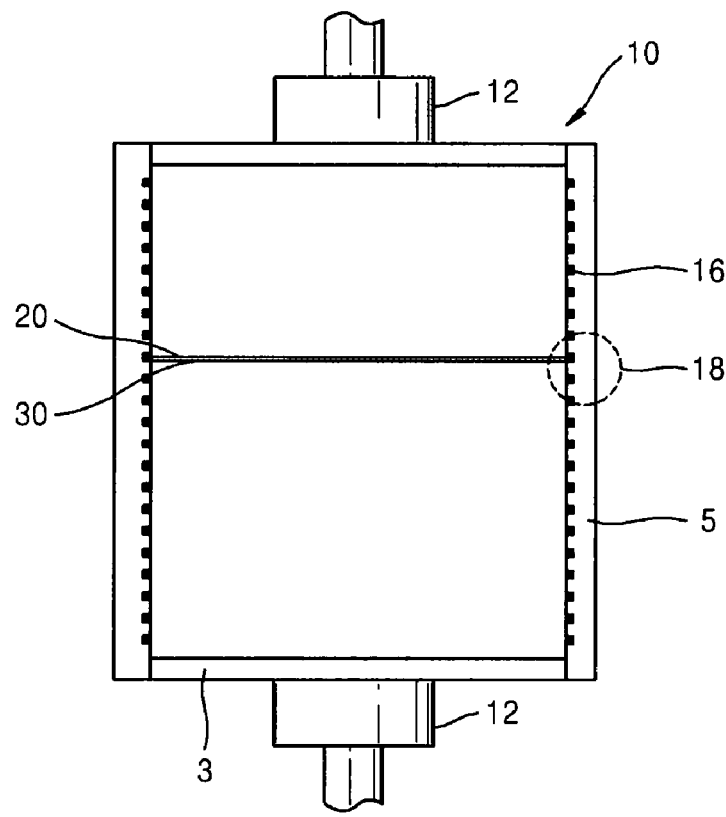
FIG. 3 is a side sectional view taken along a line III-III' of FIG. 1, the view being seen from the right side of the magazine of FIG. 1.
Figure 4:
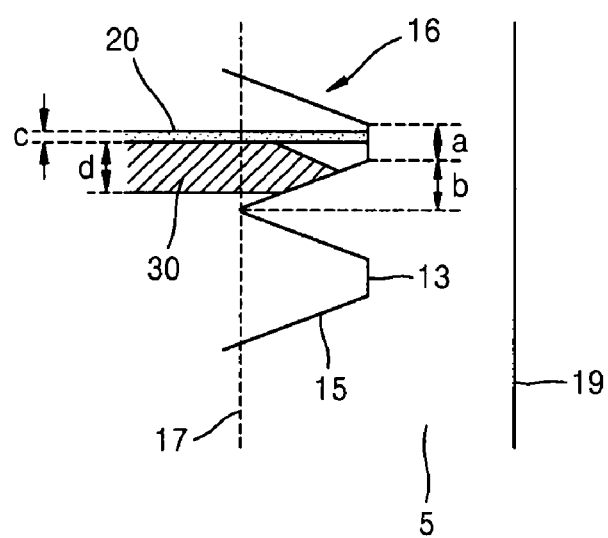
FIG. 4 is an enlarged diagram of a portion of FIG. 3.

FIG. 3 is a side sectional view taken along a line III-III' of FIG. 1, the view being seen from the right side of the magazine of FIG. 1, and FIG. 4 is an enlarged diagram of a portion 18 illustrating one of a plurality of slot ends 16 of FIG. 3.

In detail, FIG. 3 illustrates the lead frame 20 loaded on the moving carrier 30 inside the magazine 10. FIG. 4 is the enlarged diagram of the portion 18 of FIG. 3, in which the slot end 16 located at one end of the slot 14 is shown. The magazine 10, containing the moving carrier 30 and the lead frame 20, is fixed essentially motionless by the magazine jig 12, and includes a horizontal body 3 and a vertical body 5 including the plurality of slots 14. The slot end 16 is installed at the end of each slot 14, and the moving carrier 30 or the lead frame 20 is inserted into the slot 14 via the slot end 16.

The slot ends 16 are formed correspondingly to the slots 14 on the boundary of the magazine 10. The slot ends 16 may have a dentate form, or a trapezoid form wherein the bottom side is wide and the topside is narrow with respect to an imaginary dotted line 17. Also, the slot ends 16 may have a ladder form and include a parallel portion 13 (topside portion) parallel to the boundary of the magazine 10, i.e., a boundary 19 of the vertical body 5, and a slope portion 15 sloping with respect to the boundary of the magazine 10. In the present embodiment, the parallel portion 13 has a thickness "a" and the slope portion 15 has a thickness "b." A thickness "d" of the moving carrier 30 is smaller than the thickness "b" of the slope portion 15 and larger than a thickness "c" of the lead frame 20. Accordingly, the moving carrier 30 has sufficient rigidity to support the lead frame 20 and thus allow the lead frame 20 to be smoothly inserted into the slot end 16 of the magazine 10.

Figure 5:
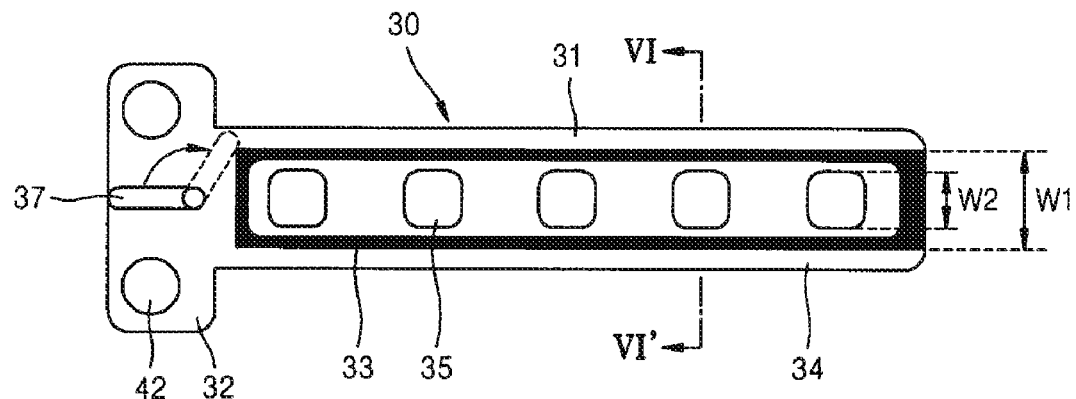
FIG. 5 is a plan view illustrating a moving carrier according to an embodiment of the present inventive concept.
Figure 6:
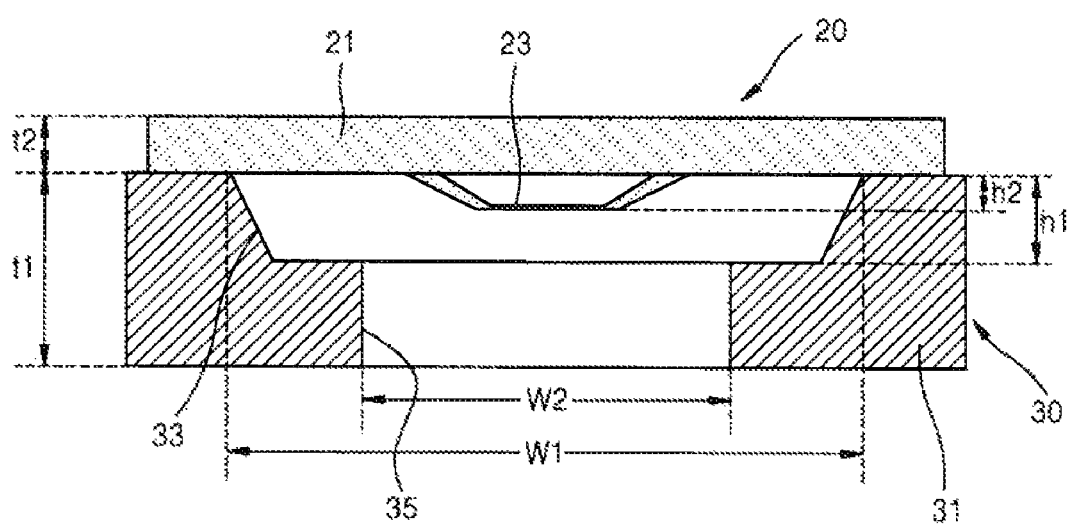
FIG. 6 is a cross-sectional view taken along a line VI-VI' of FIG. 5.

FIG. 5 is a plan view illustrating the moving carrier 30 according to an embodiment of the present inventive concept, and FIG. 6 is a cross-sectional view taken along a line VI-VI' of FIG. 5.

In detail, the moving carrier 30 has a T shape as illustrated in FIG. 5. The size of the moving carrier 30 corresponds to the size of the slot 14 of the magazine 10 and the lead frame 20. The moving carrier 30 includes a retaining portion 34 and a handling portion 32. The retaining portion 34 holds the lead frame 20, and the handling portion 32 extends from the retaining portion 34 and protrudes up and down so that the moving carrier 30 can be held manually by a person or mechanically by a mechanical device. That is, the handling portion 32 protrudes to a greater extent than the retaining portion 34 of the moving carrier 30 in a direction perpendicular to the insertion direction of the slot 14 so that the moving carrier 30 can be held manually by a person or mechanically by a mechanical device.

Thus, the person or the mechanical device does not directly contact the lead frame 20 because of the handling portion 32. The retaining portion 34 and the handling portion 32 of the moving carrier 30 may be formed as a single body. The moving carrier 30 may be formed of a metal material having sufficient rigidity and low susceptibility to deformation. The retaining portion 34 may include a groove portion 33. The groove portion 33 may be formed as a single body in the moving carrier 30 via a punching process, or the like. That is, the groove portion 33, formed as a single body with the holding portion 32, may be formed in the moving carrier 30 via a punching process, or the like.

As illustrated in FIG. 6, according to various considerations such as the size of a semiconductor chip (not shown), a concave portion, i.e., a chip attach pad 23 or a die attach pad, may be formed on the surface of the lead frame 20. The lead frame 20 includes a body 21 and the chip attach pad 23 upon which the chip can be placed.

The chip attach pad 23 of the lead frame 20 is disposed lower than the body 21. The moving carrier 30 includes a base 31 that supports the lead frame 20. The base 31 can be formed of a metal material having high rigidity, and the base 31 can have a T shape, as illustrated in FIG. 5. A thickness t1 of the base 31 is thicker than a thickness t2 of the lead frame 20 so as to rigidly support the lead frame 20.

The moving carrier 30 includes the groove portion 33, which can be an integrated part of the base 31 and provide space for the chip attach pad 23 of the lead frame 20. The size of groove portion 33 can be determined so as to correspond to the size of chip attach pad 23, to prevent the chip attach pad 23 from contacting a surface of moving carrier 30 or catching on the moving carrier 30 while moving the lead frame 20 relative to the moving carrier 30.

As illustrated in FIG. 6, when the lead frame 20 is loaded on the moving carrier 30, a height h1 of the groove portion 33 provides sufficient space for the chip attach pad 23, and a width W1 of the groove portion 33 provides enough space so that the periphery of the lead frame 20 sufficiently contacts the top surface of the moving carrier 30. Thus, the chip attach pad extends below the lead frame by a pre-determined distance h2, and a height h1 of the groove is greater than the predetermined distance. Accordingly, the moving carrier 30 can rigidly support the lead frame 20 in a vertical direction.

A plurality of groove holes 35 may be selectively formed in the retaining portion 34 of the moving carrier 30. The plurality of groove holes 35 in the retaining portion 34 may have a matrix structure, for example, a 1×5 or 2×6 matrix structure, at a predetermined interval. The locations of the groove holes 35 can correspond to each chip 22 bonded to the lead frame 20 or the chip attach pad 23. In the plan view of FIG. 5, the groove holes 35 are in a matrix form that corresponds to that of the chip attach pad 23.

The size of each of the groove holes 35 may vary according to different requirements, such as according to the size of chip attach pad 23. In the cross sectional view of FIG. 6, the groove holes 35 are formed below the groove portion 33, and each expose a part of the chip attach pad 23 by being connected to the groove portion 33.

During an inspection step, a destructiveness test of the metal bonding wires 26 (a ball pull test for example) can be performed using tweezers or an ink pen. After the destructiveness test using the tweezers or the ink pen is performed, the metal bonding wires 26 left on the chip 22 are removed. Accordingly, the destruction on the surface of the moving carrier 30 supporting the lead frame 20 is inevitable during such an operation using conventional lead frame supports. However according to the present inventive concept, scratches or ink traces are not left on the surface of the moving carrier 30 during an inspection because of the groove holes 35. Moreover, a width W2 of each of the groove holes 35 is smaller than the width W1 of the groove portion 33, and thus, the overall rigidity of the moving carrier 30 is maintained.

A rotatable fixture 37 may be installed on the handling portion 32 of the moving carrier 30 so that the lead frame 20 is stably fixed on the moving carrier 30. As illustrated in FIG. 5, the rotatable fixture 37 may be installed at the end of the moving carrier 30. After loading the lead frame 20 on the retaining portion 34 of the moving carrier 30, the rotatable fixture 37 is rotated into contact with the periphery of the lead frame 20, thereby fixing and supporting the lead frame 20 in a horizontal direction. Accordingly, the lead frame 20 does not move relative to the moving carrier 30. In FIG. 5, the handling portion 32 further includes one or more handling holes 42 to allow the handling portion 32 of the moving carrier 30 to be held with the hand or a mechanical device.

Figure 7:
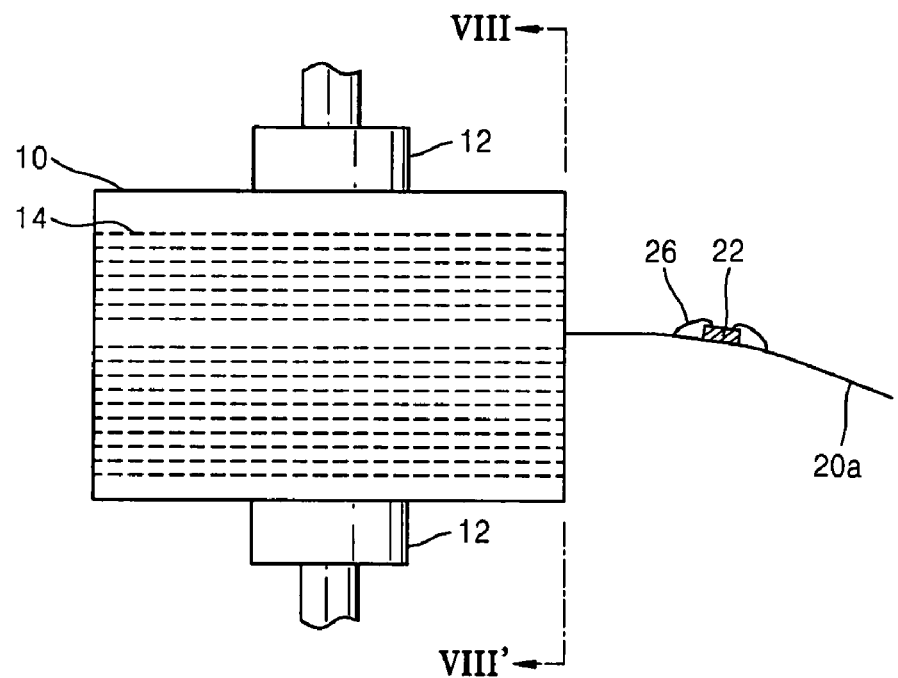
FIG. 7 is a diagram illustrating insertion of a lead frame into a magazine without a moving carrier.

FIG. 7 is a diagram illustrating insertion of a lead frame into a magazine without a moving carrier. FIG. 7 is a comparative example for comparison with the embodiments of FIGS. 1 and 2.

According to the comparative example of FIG. 7, a lead frame 20a is directly inserted into one of the slots 14 of the magazine 10. In this case, the lead frame 20a bends or deforms due to stress while the lead frame 20 is being inserted or withdrawn to or from the slot 14, and the metal bonding wires 26 sag. Moreover, a person's hand or a mechanical device contacts the lead frame 20a while the lead frame 20a is being inserted or withdrawn to or from the slot 14, thereby causing defects in the lead frame 20a.

Figure 8:
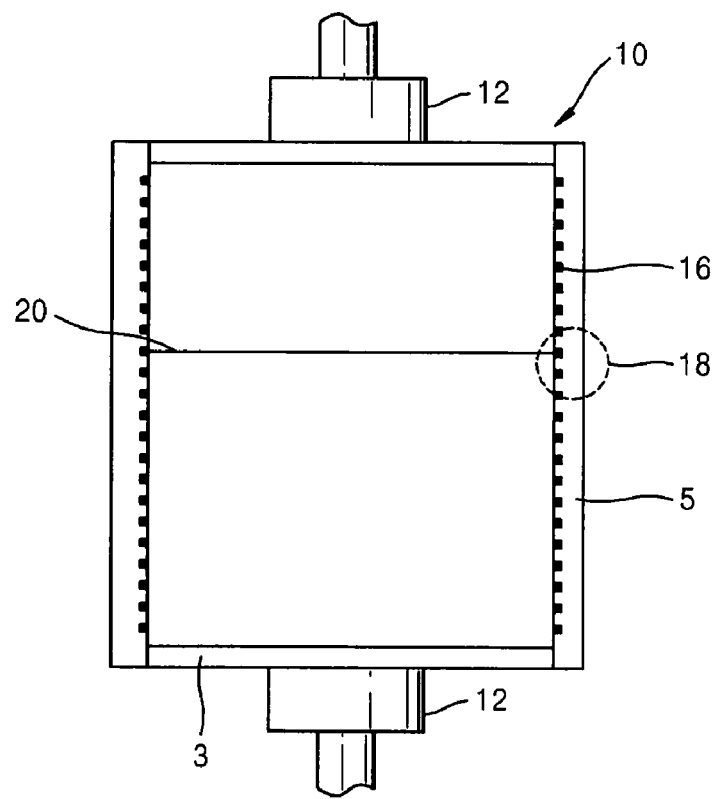
FIG. 8 is a is a side sectional view taken along a line VIII-VIII' of FIG. 7, the view being seen from the right side of a magazine of FIG. 7 and for comparison with the view of FIG. 3.
Figure 9:
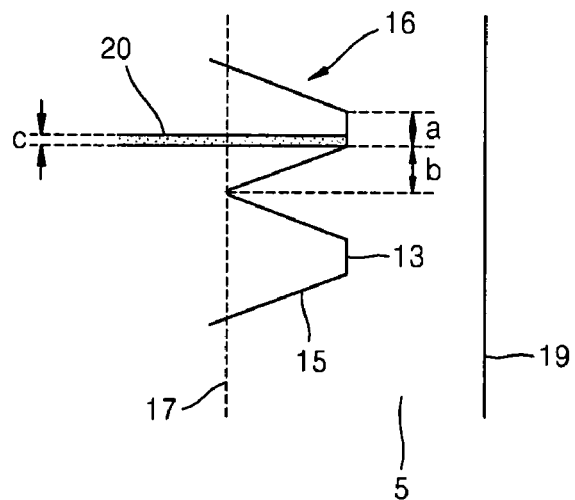
FIG. 9 is a diagram of an enlarged portion of FIG. 8 for comparison with the embodiment of FIG. 4.

FIG. 8 is a side sectional view taken along a line VIII-VIII' of FIG. 7, the view being seen from the right side of a magazine of FIG. 7 and for comparing with the view of FIG. 3. FIG. 9 is a diagram of an enlarged portion of FIG. 8 for comparison with the embodiment of FIG. 4.

In detail, FIG. 8 illustrates the lead frame 20 loaded in the slot 14 of the magazine 10, and FIG. 9 is an enlarged diagram of a portion 18 of FIG. 8. When the lead frame 20 is inserted into the slot end 16, the thickness "c" of lead frame 20 is less than the thickness "a" of the parallel portion 13 and the thickness "b" of the slope portion 15, as illustrated in FIG. 9.

For example, the relational equations of "c":"a"<1:5 and "c":"b"<1:10 are satisfied. As such, due to the difference between the thicknesses of the lead frame 20 and the slot end 16, it is difficult to guarantee the rigidity of the lead frame 20 while the lead frame 20 is being inserted or withdrawn into or out from the slot end 16.

A method of inserting and withdrawing the lead frame 20 into and out from the magazine 10 by using the moving carrier 30, i.e., a method of moving the lead frame 20, will now be described with reference to FIGS. 1 through 6 and FIGS. 10 and 11.

Figure 10:
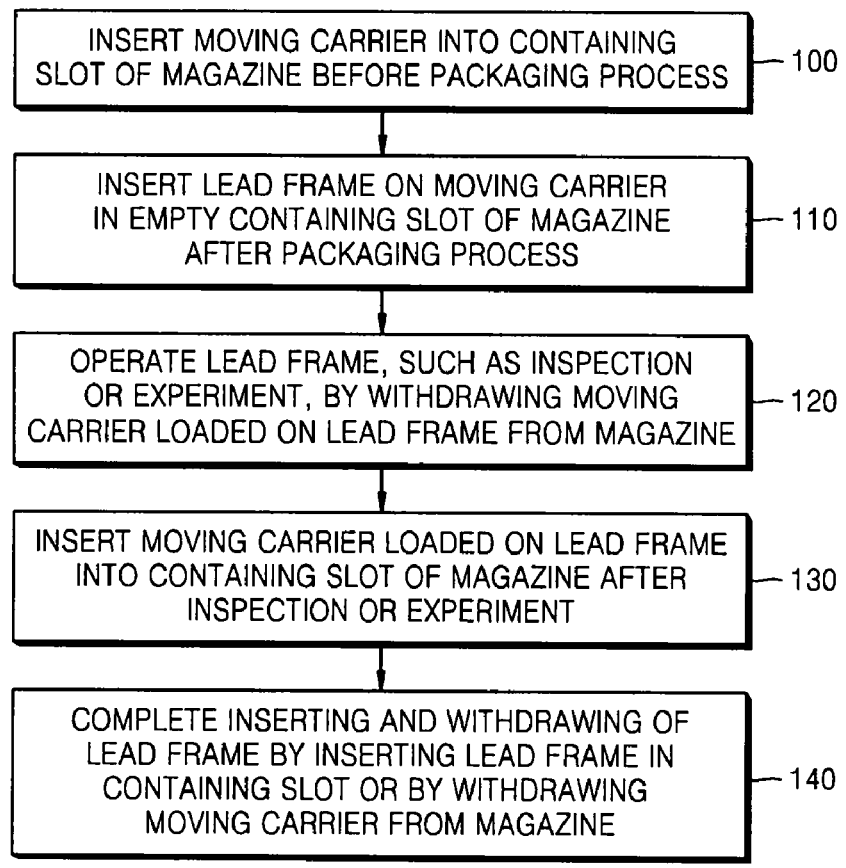
FIG. 10 is a flowchart of a method of moving the lead frame, according to an embodiment of the present inventive concept.

FIG. 10 is a flowchart of the method of moving the lead frame 20, according to an embodiment of the present inventive concept.

In detail, the moving carrier 30 described above is prepared, and the lead frame 20 is loaded on the moving carrier 30 located in the slot 14 of the magazine 10. In other words, before performing a packaging process, such as a chip attaching process, a lead bonding process or a molding process, the moving carrier 30 is inserted in the empty slot 14 of the magazine 10, in operation 100. Then, after the packaging process, the lead frame 20 is inserted and disposed on the moving carrier 30 in the slot 14 of the magazine 10, in operation 110. That is, the lead frame 20 is inserted into the magazine onto the moving carrier 30 after the packaging process.

The lead frame 20 may be automatically inserted into the slot 14 by a mechanical device. Accordingly, the locations of the chip attach pad 23 of the lead frame 20 and the groove portion 33 of the moving carrier 30 correspond to each other. Selectively, after the packaging process, the lead frame 20 located on the moving carrier 30 and the moving carrier 30 may be fixed together by the rotatable fixture 37 that rotates into contact with the periphery of the lead frame 20.

Then, the moving carrier 30 loaded on the lead frame 20 is withdrawn from the magazine 10 so as to manipulate the lead frame 20, for example, to perform an inspection or an experiment, in operation 120. When the moving carrier 30 loaded on the lead frame 20 is withdrawn from the magazine 10, the lead frame 20 does not need to be directly touched by personnel or equipment, and thus the lead frame 20 is not deformed due to stress.

After testing or inspecting the lead frame 20 loaded on the moving carrier 30, the moving carrier 30 is inserted into the slot 14 of the magazine 10, in operation 130. Here, the moving carrier 30 may be inserted by a person holding the moving carrier 30. In other words, the moving carrier 30, holding the lead frame 20, can be manually held and inserted into the slot 14 via the slot ends 16.

After inserting the moving carrier 30 into the slot 14 of the magazine 10, the lead frame 20 and the moving carrier 30 may selectively be unfixed. In other words, the rotatable fixture 37 can be rotated so as to separate the rotatable fixture 37 from the periphery of the lead frame 20, thereby unfixing the lead frame 20 and the moving carrier 30.

The lead frame 20 is left in the slot 14 by withdrawing the moving carrier 30 from the magazine 10, in operation 140. In other words, the moving carrier 30 is withdrawn while supporting the external lead frame 20 by means such as a tool or a fingernail, thereby leaving the lead frame 20 in the slot 14. As such, inserting and withdrawing the lead frame 20 into and out from the magazine 10 is completed.

As a result, the deformation of the lead frame 20 due to stress or sagging of the metal bonding wires 26 is prevented while withdrawing or inserting the lead frame 20 from or into the magazine 10 by using the moving carrier 30.

Figure 11:
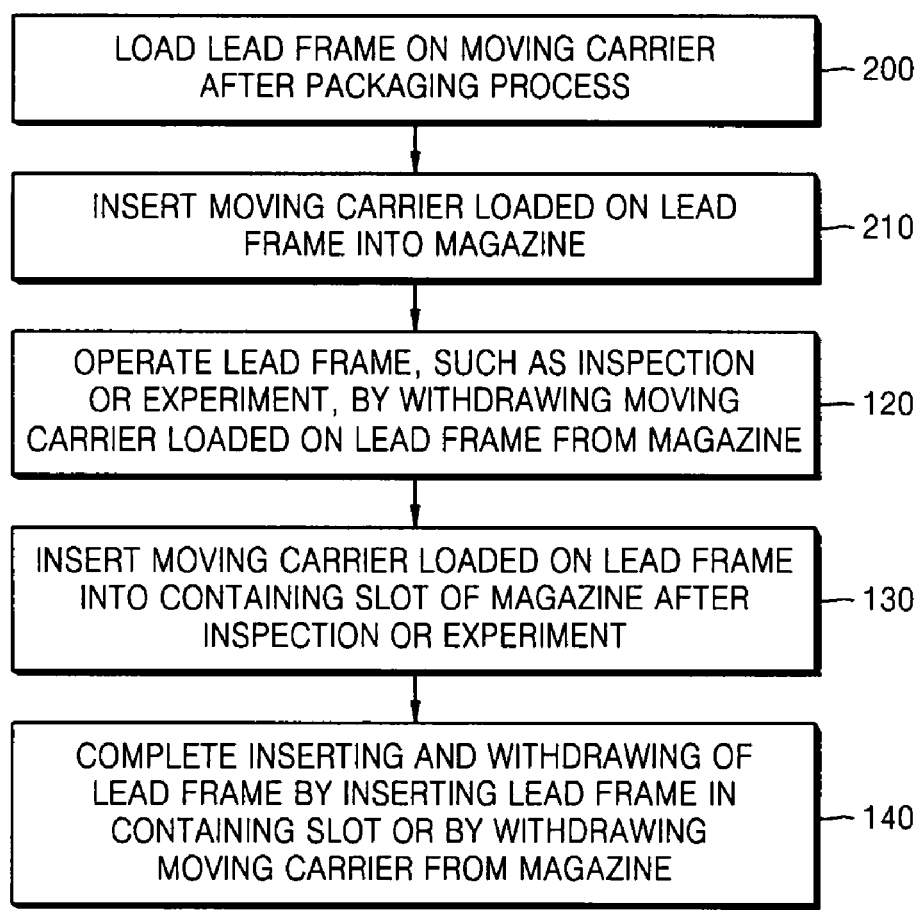
FIG. 11 is a flowchart of a method of moving the lead frame, according to another embodiment of the present inventive concept.

FIG. 11 is a flowchart of a method of moving the lead frame 20, according to another embodiment of the present inventive concept.

In detail, the moving carrier 30, as described above, is prepared, and the lead frame 20 is loaded on the moving carrier 30 located in the slot 14 of the magazine 10. In other words, after performing the packaging process, such as a chip attaching process, a lead bonding process or a molding process, the lead frame 20 is loaded on the moving carrier 30 in operation 200.

After the packaging process, the lead frame 20 is loaded on the moving carrier 30 using a mechanical device. In other words, the lead frame 20 and the moving carrier 30 are located in such a way that the lead frame 20 corresponds to the groove portion 33 of the moving carrier 30 using mechanical equipment. Selectively after the packaging process, the rotatable fixture 37 is rotated into contact with the periphery of the lead frame 20, thereby fixing the lead frame 20 with the moving carrier 30.

Then, the moving carrier 30 loaded on the lead frame 20 is inserted into the slot 14 of the magazine 10, in operation 210. The moving carrier 30 loaded on the lead frame 20 may be inserted into the magazine 10 by hand or using a mechanical device.

Then, operations 120 through 140 of the method according to the previous embodiment are performed so as to leave the lead frame 20 in the slot 14 of the magazine 10. Accordingly, inserting and withdrawing of the lead frame 20 into and from the magazine 10 are completed.

According to an aspect of the present inventive concept, there is provided a moving carrier for moving a lead frame. The moving carrier includes a base which supports the lead frame including a body and a chip attach pad on which a chip is disposed. The moving carrier includes a groove portion which is integrated with a part of the base and contains the chip attach pad of the lead frame.

According to another aspect of the present inventive concept, there is provided a moving carrier for moving a lead frame. The moving carrier includes a base which comprises a retaining portion that contains the lead frame including a body and a chip attach pad on which the chip is disposed. The moving carrier includes a handling portion that can be mechanically or manually held; a groove portion which is formed in the retaining portion of the base and contains the chip attach pad of the lead frame, and a rotatable fixture which is installed in the holding portion of the base, and fixes the lead frame.

According to another aspect of the present inventive concept, there is provided a method of moving a lead frame by using the moving carrier as mentioned above. The method includes preparing the moving carrier, and loading the lead frame on the moving carrier located in one of a plurality of slots of a magazine, operating the lead frame by withdrawing the moving carrier that is loaded on the lead frame from the magazine. The method includes inserting the moving carrier into the slot of the magazine, after operating the lead frame loaded on the moving carrier, and leaving the lead frame in the slot of the magazine by withdrawing the moving carrier from the magazine.

The present inventive concept is related to a moving carrier for a lead frame, and a method of moving a lead frame using the moving carrier, wherein the lead frame is not manually held by a person. In other words, the present inventive concept is related to a moving carrier for the lead frame, and a method of inserting or withdrawing a lead frame into or out from a magazine using the moving carrier. Accordingly, the lead frame is not directly touched by a person while being inserted or withdrawn into and out from the magazine, and thus, deformation of the lead frame due to stress is prevented and sagging of metal bonding wires on the lead frame is prevented.

While the present inventive concept has been particularly shown and described with reference to exemplary embodiments thereof, it will be understood by one of ordinary skill in the art that various changes in form and details may be made therein without departing from the spirit and scope of the present inventive concept as defined by the following claims.

What is claimed is:

1. A lead frame moving carrier for carrying and moving a lead frame, the lead frame moving carrier comprising:
   a base including a handling portion and a retaining portion, the retaining portion configured to mechanically support a periphery of a lead frame, the lead frame including a body and a chip attach pad on which a chip is disposed; and
   a groove disposed in the retaining portion of the base and configured such that a chip attach pad of the lead frame does not contact the base when the lead frame is supported by the retaining portion,
   wherein the retaining portion extends in a first direction and the handling portion extends in a second direction substantially perpendicular to the first direction.

2. The moving carrier of claim 1, wherein a height of the groove is greater than a height of the chip attach pad, and wherein a thickness of the base is greater than a thickness of the lead frame.

3. The moving carrier of claim 1, wherein the base includes a rotatable fixture configured to fix the lead frame to the base.

4. The moving carrier of claim 1, further comprising a plurality of groove holes disposed below the groove, wherein each of the groove holes exposes at least a portion of the chip attach pad of the lead frame.

5. The moving carrier of claim 4, wherein a width of each of the groove holes is smaller than a width of the groove.

6. The moving carrier of claim 1, wherein the handling portion of base extends beyond the length of the of the retaining portion.

7. The moving carrier of claim 6, wherein the handling portion comprises a rotatable fixture that fixes the lead frame to the base.

8. The moving carrier of claim 6, wherein the base has a T shape.

9. The moving carrier of claim 6, wherein the handling portion of the base comprises at least one handling hole.

10. A moving carrier for carrying a lead frame including a body and chip attach pad on which a chip is disposed, the moving carrier not affixed to any of lead frame, a chip attach pad, or a chip, the moving carrier comprising:
   a base including:
      a retaining portion configured to hold a lead frame, the lead frame comprising a body and a chip attach pad on which a chip is disposed; and a handling portion configured to allow mechanical or manual handling of the lead frame, wherein the retaining portion extends in a first direction and the handling portion extends in a second direction substantially perpendicular to the first direction;

a groove portion disposed in the retaining portion of the base and configured to receive the chip attach pad of the lead frame; and a rotatable fixture disposed in the handling portion of the base, the rotatable fixture configured to fix the lead frame to the base.

11. The moving carrier of claim 10, wherein the base, comprising the handling portion and the retaining portion, has a T shape.

12. The moving carrier of claim 10, wherein the chip attach pad is disposed lower than the body, and wherein a height of the groove portion is greater than a height of the chip attach pad.

13. The moving carrier of claim 10, further comprising a plurality of groove holes disposed below the groove portion, wherein each of the groove holes exposes at least a portion of the chip attach pad of the lead frame.

14. The moving carrier of claim 10, wherein the handling portion of the base comprises at least one handling hole.

15. A moving carrier comprising:
a base including a handling portion and a retaining portion, the retaining portion configured to mechanically support a periphery of a lead frame;

a groove disposed in the retaining portion of the base, the groove configured such that a chip attach pad of the lead frame does not contact the base when the lead frame is supported by the retaining portion;

a plurality of groove holes disposed in the groove;

a rotatable fixture disposed on the handling portion of the base, the rotatable fixture configured to engage the lead frame; and at least one handling hole disposed in the handling portion of the base;

wherein the retaining portion extends in a first direction and the handling portion extends in second direction substantially perpendicular to the first direction.

16. The moving carrier of claim 15, wherein the base, comprising the handling portion and the retaining portion, has a T shape.

17. The moving carrier of claim 15, wherein the chip attach pad extends below the lead frame by a pre-determined distance and wherein a height of the groove is greater than the predetermined distance.

18. The moving carrier of claim 15, wherein the retaining portion extends beyond the length of the handling portion.

* * * * *